United States Patent [19]

Ma et al.

[11] Patent Number: 4,855,247

[45] Date of Patent: Aug. 8, 1989

[54] PROCESS FOR FABRICATING SELF-ALIGNED SILICIDE LIGHTLY DOPED DRAIN MOS DEVICES

[75] Inventors: Di Ma, Syosset; David H. Hoffman, Hauppauge, both of N.Y.

[73] Assignee: Standard Microsystems Corporation, Hauppauge, N.Y.

[21] Appl. No.: 291,541

[22] Filed: Dec. 29, 1988

Related U.S. Application Data

[62] Division of Ser. No. 145,390, Jan. 19, 1988.

[51] Int. Cl.[4] .................. H01L 21/265; H01L 21/44; H01L 21/48
[52] U.S. Cl. ..................... 437/44; 437/200; 437/202; 437/41; 437/931; 156/643; 156/653; 357/23.3; 148/DIG. 147; 148/DIG. 105
[58] Field of Search ............... 437/40, 41, 43, 44, 437/200, 196, 202, 931, 34, 56, 57; 357/23.3, 23.4, 23.9, 23.11; 156/643, 650, 651, 652, 653; 148/DIG. 131, DIG. 147, DIG. 105

[56] References Cited

U.S. PATENT DOCUMENTS

| | | | |
|---|---|---|---|
| 4,330,931 | 5/1982 | Liu | 437/24 |
| 4,577,391 | 3/1986 | Hsia et al. | 437/44 |
| 4,577,392 | 3/1986 | Peterson | 437/200 |
| 4,587,718 | 5/1986 | Haken et al. | 437/200 |
| 4,593,454 | 6/1986 | Baudrant et al. | 437/200 |
| 4,599,789 | 7/1986 | Gasner | 437/41 |
| 4,622,735 | 11/1986 | Shibata | 437/200 |
| 4,657,628 | 4/1987 | Holloway et al. | 437/200 |
| 4,703,551 | 11/1987 | Szluk et al. | 437/57 |
| 4,728,617 | 3/1988 | Woo et al. | 437/44 |
| 4,735,680 | 4/1988 | Yen | 437/41 |
| 4,744,859 | 5/1988 | Hu et al. | 437/41 |
| 4,746,219 | 5/1988 | Holloway et al. | 437/200 |
| 4,788,160 | 11/1988 | Havemann et al. | 437/44 |

FOREIGN PATENT DOCUMENTS

| | | | |
|---|---|---|---|
| 0091775 | 10/1983 | European Pat. Off. | 437/200 |
| 0157024 | 12/1981 | Japan | 437/200 |
| 0111706 | 6/1984 | Japan | 437/200 |
| 0200418 | 11/1984 | Japan . | |
| 0128659 | 7/1985 | Japan | 437/200 |
| 0095550 | 5/1986 | Japan | 437/200 |
| 0096764 | 5/1986 | Japan . | |
| 0097975 | 5/1986 | Japan . | |
| 0101075 | 5/1986 | Japan . | |
| 0144069 | 7/1986 | Japan . | |
| 0214474 | 9/1986 | Japan . | |
| 0258447 | 11/1986 | Japan | 437/44 |
| 0287227 | 12/1986 | Japan | 437/200 |
| 8605321 | 9/1986 | World Int. Prop. O. | 437/200 |
| 8700967 | 2/1987 | World Int. Prop. O. | 437/200 |

OTHER PUBLICATIONS

Wang, "Lithographically Defined Self-Aligned Double-Implanted Doped FET Device", IBM Technical Disclosure Bulletin, vol. 27, No. 8, Jan. 1985, pp. 4629–4631.

*Primary Examiner*—Olik Chaudhuri
*Assistant Examiner*—M. Wilczewski
*Attorney, Agent, or Firm*—Hopgood, Calimafde, Kalil, Blaustein & Judlowe

[57] ABSTRACT

In a method for fabricating an MOS structure, in accordance with one embodiment, a layer of material that serves as an etching stop during the side wall spacer etch, is inserted between the silicon substrate and the side wall spacer. In another embodiment of the invention, after establishing differential layer thicknesses on the source/drain surface, the side wall spacer is completely removed and light and heavy ion implantation steps are performed sequentially with one single lithographic step. In a further embodiment of the invention, after the self-aligned silicide is formed, the side wall spacer is removed, and light and heavy ion implantation steps are sequentially performed.

12 Claims, 2 Drawing Sheets

4,855,247

PROCESS FOR FABRICATING SELF-ALIGNED SILICIDE LIGHTLY DOPED DRAIN MOS DEVICES

This is a divisional of Ser. No. 145,390, filed Jan. 19, 1988.

BACKGROUND OF THE INVENTION

1. Field Of The Invention

This invention relates generally to the fabrication of metal-silicon dioxide semiconductor (MOS) devices, and more particularly to the fabrication of self-aligned silicide and lightly doped drain MOS device structures.

2. Description Of The Related Art

Recent developments in MOS fabrication techniques have produced MOS devices in which ever-decreasing device dimensions are realized in order to achieve greater device density and increased operating speeds. This decrease in MOS device dimensions has, however, created a concern over the high sheet resistance in the source/drain regions and hot carrier injection.

That is, as device dimensions continue to decrease, the junction depths of the source/drain regions are reduced so as to minimize parasitic effects. One direct result of this reduction in the source/drain junction depth is an increase of the sheet resistance of the source/drain regions. Another result of decreasing device dimensions bears on the junction integrity when a metal layer is applied to make a contact to the source/drain regions. The shallower the junction, the more difficult it is to reduce the leakage current of the source/drain regions to the substrate.

In order to reduce the sheet resistance of the source/drain regions, a device structure has been developed, known as a self-aligned silicide structure, in which a metal silicide film is formed at the source/drain regions as well as at the polysilicon gate. In a conventional method for fabricating a self-aligned silicide structure, a silicon dioxide side wall spacer is formed before the source/drain and polysilicon regions are silicided. In this conventional process the side wall spacer etch has to clear the source/drain regions that are not intended to be covered by the side wall spacer so that these regions can be silicided. However, since the junctions are already formed, any significant etch into the silicon of the source/drain regions will reduce the junction depth. This is compounded by the fact that during the silicide formation, the top silicon layer of the source/drain regions is consumed by the silicide, thus further reducing the junction depth. As a result, in order to successfully fabricate a self-aligned silicide MOS device by the conventional fabrication process, all the silicon dioxide in the desired silicon region must be cleared without etching significantly into the junctions.

The performance of MOS integrated circuits is also enhanced by decreasing the separation between the source and drain of an MOS transistor, also known as the effective channel length. However, the applied drain-to-source voltage is kept at a constant level irrespective of reductions in channel length which results in a higher electric field being established across the channel region. This elevated electric field has the ability to inject the carriers (electrons or holes) in the channel region across the silicon and silicon dioxide interface and to trap the carriers in the oxide. Since the silicon dioxide layer forms the gate insulator of the MOS device, the trapped charges in the gate oxide have an effect on the electrical characteristics of the device. This is a particular concern from the reliability standpoint since the longer the drain-to-source voltage is applied, the more charges are trapped.

This phenomenon can be alleviated by using a lightly doped drain (LDD) structure in which a lightly doped region is inserted between the channel and the heavily doped source/drain regions. The lightly doped region has the effect of reducing the peak electric field in the channel region, thereby alleviating the hot carrier injection problem. One common way of implementing an LDD structure requires the formation of a side wall spacer, and hence is called a SWS-LDD (side wall spacer lightly doped drain) structure.

The construction of the SWS-LDD device requires the formation of a side wall spacer that is adjacent to the polysilicon gate. This side wall spacer is formed between two ion implantation steps; the first is a light implant, the second is a heavy implant to define the lightly and heavily doped regions, respectively. When the SWS-LDD structure is implemented in CMOS (complementary MOS) technology, two lithographic steps are required for each dopant polarity, one for each of the implants. For the non-LDD structure, only one such lithographic step is required since only one implant is needed.

As a result of the junction integrity problem described above, it has been proposed that the junctions be formed after silicidation, so that the impurities are implanted into or through the silicide. During the subsequent heat treatment, impurities in the silicide diffuse into the silicon to form the junctions. In addition, it is desirable to combine the self-aligned silicide feature with the LDD structure for advanced MOS device applications. When a self-aligned silicide is implemented with an SWS-LDD structure on a CMOS device, one additional lithographic step is required for each dopant polarity to fabricate the device.

In summary, the following three problems or disadvantages are recognized with regard to the fabrication of self-aligned silicide and lightly doped drain MOS structures:

(1) in the implementation of a self-aligned silicide structure, the side wall spacer etching has to be critically controlled;

(2) in the implementation of an SWS-LDD structure in CMOS, an additional lithographic step is required; and (3) in the implementation of a self-aligned silicide LDD structure in which the junctions are formed after metal deposition or silicide formation, an additional lithographic step is required.

SUMMARY OF THE INVENTION

It is a general object of the present invention to provide an improved process for fabricating MOS devices having reduced dimensions in which one or more of the aforesaid problems are alleviated or eliminated.

It is also an object of the invention to provide a process for fabricating a self-aligned silicide MOS structure in which far greater processing latitude in side wall spacer etching is allowed.

It is another object of the invention to provide a process for fabricating a CMOS structure with a side wall spacer and lightly doped drain (SWS-LDD) features, which requires only one lithographic step for each source/drain dopant polarity.

It is a further object of the invention to provide a process for fabricating a CMOS self-aligned silicide lightly doped drain structure in which the silicide is formed or the metal is deposited which eventually forms silicide before the junction formation with one lithographic step for each source/drain dopant polarity.

In one embodiment of the invention, a layer of material is grown or deposited before the deposition of the side wall spacer material. The material of this layer has a different etching characteristic than that of the side wall spacer material and the silicon substrate. During the subsequent side wall spacer etch, this material serves as an etching stop. A second and different etch that has a substantially lower etch rate of the silicon substrate and side wall spacer material is then applied to remove the material in areas not covered by the side wall spacer.

In a second embodiment of the invention, a polysilicon gate is defined and a first layer is grown before the deposition of the side wall spacer material. The material of the first layer has a different etching characteristic than that of the silicon substrate and side wall spacer material. During the subsequent side wall spacer etch, this material serves as an etching stop. A second and different etch that has a substantially lower etch rate of the silicon substrate and side wall spacer material is then applied to remove the first layer of material in areas not covered by the side wall spacer. A second layer of material is grown over the exposed silicon substrate to a thickness whose ion implantation stopping power is less than that of the first layer. The side wall spacer is then removed, and two sequential ion implantations of the same polarity are performed after a lithographic step to define the regions that are to receive such implants. These two implants define, respectively, the lightly and heavily doped regions.

In a third embodiment of the invention, after a polysilicon gate is defined, a first layer of material is deposited before the deposition of the side wall spacer material. This first layer of material has a different etching characteristic than that of the silicon substrate and side wall spacer material. During the subsequent side wall spacer etch, this material serves as an etching stop. A second and different etch that has a substantially lower etch rate of the silicon substrate and side wall spacer material is applied to remove this material in the area not covered by the side wall spacer. Silicide is formed selectively over the silicon and polysilicon regions and the side wall spacer is etched away. For certain silicides that cannot withstand this etching environment, a layer of a second material may be selectively grown or deposited over the silicide but not on the side wall spacer. In addition, this second material has a different etching characteristic than that of the side wall spacer material. During the etching to remove the side wall spacer, this second material serves as an etching stop to protect the formed silicide layer. A lithographic step is performed to define the proper regions, and two sequential ion implants of the same dopant polarity are applied to form the lightly and heavily doped regions, respectively.

To the accomplishment of the above and such further objects as may hereinafter appear, the present invention relates to an improved process for fabricating MOS devices substantially as defined in the appended claims and as described in the following specification as considered with the accompanying drawings in which:

DETAILED DESCRIPTION OF THE PREFERRED EMBODIMENTS

Figure 1A:
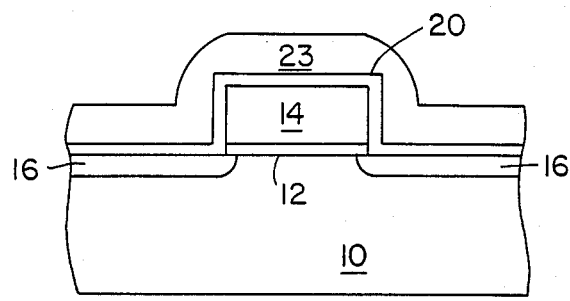
FIGS. 1(a)–1(e) are cross sections of a self-aligned silicide MOS device at various stages in its fabrication in accordance with a first embodiment of the invention.

Referring to the figures, there is shown in FIG. 1(a) a self-aligned silicide MOS integrated circuit in an early stage of its fabrication in accordance with one embodiment of the invention. As therein shown, a silicon dioxide film 12 is grown over the upper surface of a silicon substrate 10. As is per se conventional, a polysilicon gate 14 is defined over the film 12 and source/drain regions 16 are formed in the substrate 10 such as by diffusion or ion implantation. The silicon dioxide film 12 sandwiched between the substrate 10 and polysilicon gate 14 is to serve, in a known manner, as the gate insulation of the completed MOS device.

A layer of silicon dioxide 20 is then grown over the exposed surface of the substrate 10 and over the polysilicon gate 14. Although in FIG. 1(a) only a conventional singly implanted/diffused junction is shown, the method of the invention can be applied as well to other types of junctions. The silicon dioxide layer 20 may be either thermally grown or deposited by a chemical vapor deposition (CVD) method. The thickness of the silicon dioxide layer 20 is such that it does not consume too much polysilicon and the silicon substrate if it is thermally grown, but thick enough to be a good etch stop for the subsequent side wall spacer etch. If the silicon dioxide layer 20 is deposited by a CVD method, there is no concern for polysilicon and silicon consumption. A thickness of the silicon dioxide layer 20 between 150 A and 2000 A is sufficient for this purpose.

A layer of silicon nitride 23 is subsequently deposited by a CVD method, which later in the process forms the side wall spacer. The thickness of the silicon nitride layer 23 is determined by the desired width of the side wall spacer, which also depends on other factors such as the angle of the polysilicon side wall profile and the thickness of polysilicon. A thickness of silicon nitride layer 23 of 1000A or greater is needed for practical applications.

Figure 1B:
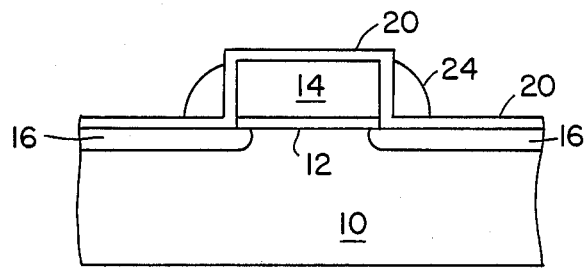

Subsequent to the silicon nitride deposition, as shown in FIG. 1(b), a directional silicon nitride etch is performed to form the silicon nitride side wall spacer 24. This is done preferably in a plasma etcher or in a reactive ion etcher. The etching process should have a sufficiently high silicon nitride etch rate and a sufficiently low oxide etch rate (good silicon nitride-to-silicon dioxide selectivity). The etch should stop when the silicon nitride in the planar surface is completely removed.

Such an etch could be accomplished in a planar plasma etcher with a two-step etch technique. The first step has the following conditions: pressure: 325 mtorr; power: 175 watt; with a gas flow of 10 sccm of argon and 60 sccm of sulfur hexafluoride ($SF_6$) The second step consists of: pressure: 325 mtorr; power: 100 watt;

gas flow: 6 sccm of argon, 30 sccm of SF$_6$ and 5 sccm of chlorodifluoromethane (CHClF$_2$)

Figure 1C:
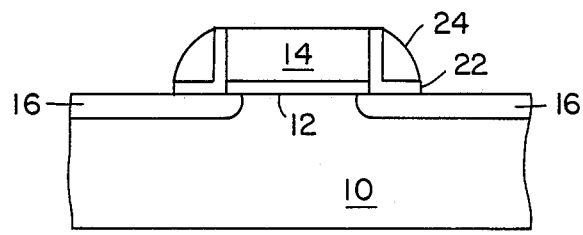

A silicon dioxide etch is then performed. This etch should have a very high silicon dioxide-to-silicon and silicon dioxide-to-silicon nitride selectivity such as can be achieved by the use of wet buffered hydrofluoric acid. The etch, as shown in FIG. 1(c), completely removes the silicon dioxide 20 over the polysilicon gate 14 as well as over the source/drain regions 16 that are not covered by the silicon nitride side wall spacer 24. As shown in FIG. 1(c), a portion 22 of the silicon dioxide layer covered by the silicon nitride side wall spacer (24) remains after the etch.

Figure 1D:
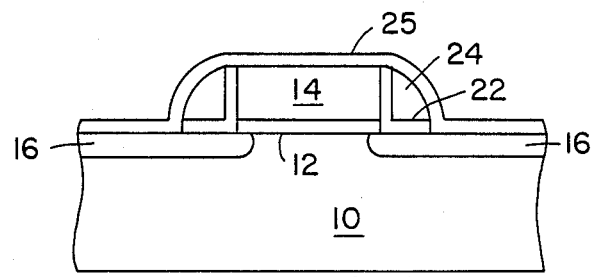
Figure 1E:
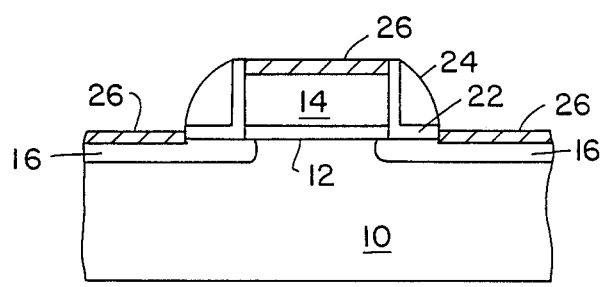

A silicide forming metal 25 such as titanium (although other metals such as tungsten and cobalt can also be used) is then deposited by conventional means over the structure of FIG. 1(c) to produce the structure shown in FIG. 1(d). The metal is then thermally reacted with the silicon underlying the metal layer 25, and a selective etch that removes the unreacted metal but removes little reacted silicide is applied. In the final structure shown in FIG. 1(e) a silicide layer 26 is formed over the polysilicon gate 14 and the source/drain regions 16 that are not covered by the silicon nitride side wall spacer 24.

In the process illustrated in FIGS. 1(a) to 1(e), as compared to the conventional self-aligned silicide process, an additional silicon dioxide layer 20 is grown and a silicon nitride rather than a silicon dioxide side wall spacer is used. During the side wall spacer etch, in the conventional process, one has to optimize the silicon dioxide-to-silicon etch selectivity and uniformity as well as the deposited silicon dioxide uniformity. In the process of FIG. 1, due to the presence of the additional silicon dioxide layer, being a material of different etching characteristics than the silicon and the silicon nitride that forms the side wall spacer, selectivity and uniformity can be independently controlled. Although reasonable silicon nitride-to-silicon dioxide etch selectivity should be maintained, which is a commonly known technique in silicon device fabrication, there is greater latitude in the silicon nitride side wall spacer etching process, since one has only to concentrate mainly on the uniformity of the etch. As long as sufficient silicon dioxide is grown in the first place, the silicon nitride-to-silicon dioxide selectivity is not as important since the silicon dioxide layer eventually is removed. This is true, in particular, since this subsequent silicon dioxide etch can be made to have very high silicon dioxide-to-silicon selectivity by the application of such chemicals as buffered hydrofluoric acid.

In the present invention, as in the embodiment of FIGS. 1(a) to 1(e), the amount of top layer of silicon removed in the source/drain junction area is determined by the thermally grown silicon dioxide layer 20, which can be very accurately controlled. The growing of the silicon oxide has the additional benefit of driving in the source/drain junction. If the silicon dioxide layer 20 is deposited by a CVD method, no such silicon loss is encountered. On the other hand, the silicon layer removed in the conventional process is determined by the side wall spacer etch which has to be compromised with respect to the uniformity of the silicon dioxide deposited and the uniformity of the side wall spacer etch. As a result, it is not as easily controlled.

The method of the invention illustrated in FIG. 2 may be used to fabricate a CMOS SWS-LDD structure with one lithographic step for each source/drain dopant polarity. The objective in this method is to create two different layer thicknesses over the source/drain regions before they receive the implants. The process sequence is identical to the first method illustrated in FIG. 1 up to the side wall spacer formation except that in the method of FIG. 2, the source/drain dopants are not introduced before the side wall spacer formation.

Figure 2A:
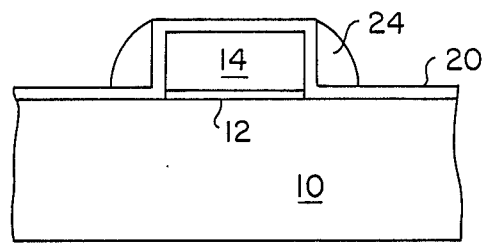
FIGS. 2(a)–2(c) are cross sections of an SWS-LDD MOS device at various stages of its fabrication in accordance with a second embodiment of the invention.

The MOS device in an early stage of its fabrication in accordance with the method of FIG. 2 is illustrated in FIG. 2(a) As therein shown, a layer of insulating material 12, such as silicon dioxide, is formed on a silicon substrate 10 and separates the substrate 10 and a polysilicon gate 14. The silicon dioxide layer 20 and the silicon nitride side wall spacer 24 are formed as in the first method.

Figure 2B:
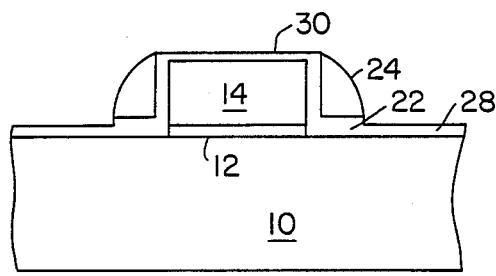
Figure 2C:
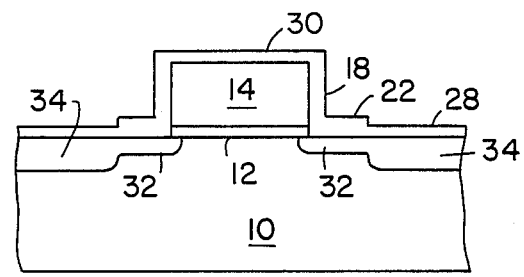

A silicon dioxide etch that has a high selectivity over silicon nitride is then performed, preferably with a plasma etching or reactive ion etching technique because of their superior etch rate control. The etch removes part of the silicon dioxide that is not protected by the silicon nitride to leave a silicon dioxide layer 28 having a reduced thickness between 100 A and 1800 A, as shown in FIG. 2(b). Alternatively, the silicon dioxide that is not covered by the silicon nitride can be completely removed by a wet chemical such as a buffered hydrofluoric acid etching technique. Subsequently, a thin layer of silicon dioxide may be regrown to a thickness between 100 A and 1800 A to produce the same structure as in FIG. 2(b). The first layer of material deposited before the side wall spacer deposition and the regrown layer need not be the same material.

Between the etch back and the regrown methods, the latter approach is preferable since the thickness of the silicon dioxide 28 not covered by the silicon nitride side wall spacer can be more precisely controlled. As a result of this step, another layer of silicon dioxide 30 is formed on top of polysilicon gate 14. At this stage of the process, as shown in FIG. 2(b), two different thicknesses of silicon dioxide are present over the source/drain regions that are to be formed. One silicon dioxide layer is under the silicon nitride side wall spacer 24 whose thickness is the same as silicon dioxide layer 20 in FIG. 2(a) and is determined by the initial growth/deposition conditions. The other silicon dioxide layer 28 is not covered by the silicon nitride side wall spacer. Silicon dioxide layer 28 should be thinner than layer 22 and its thickness is controlled by either the etching process or the regrowth process described above.

The wafer is then subjected to a silicon nitride etch that completely removes the silicon nitride side wall spacer. This can be accomplished in hot phosphoric acid etch or a plasma etch. A lithographic step is performed (not shown in the figure) to define the proper regions to receive the subsequent implants, and two separate, sequential source/drain ion implants are then performed. After a thermal anneal of the implant, the device structure is in the form shown in FIG. 2(c). One of the ion implants is a light implant to dope both the lightly doped region 32 and heavily doped region 34. The other ion implant is a heavy implant to define primarily the heavily doped region 34. The implant conditions are optimized to utilize the different silicon dioxide thicknesses over the source/drain regions. This selection can be accomplished by using two different species of the same polarity (such as arsenic and phosphorus for the n-type dopant) that have significantly different penetration depths (projected ranges). It can also be accomplished by using the same species but with different implant energies resulting in different penetration depths.

The actual implant conditions are subject to other considerations such as the desired sheet resistance of each of the doped regions, and the surface concentration of the lightly doped region, which also determines the hot carrier injection immunity of the structure. The ion implant condition is also influenced by the subsequent thermal anneal to allow sufficient lateral movement of the lightly doped region to cross the width of the silicon dioxide 18 on the polysilicon side wall. This latter consideration also plays a role in determining the initial thickness of the silicon dioxide layer 20.

Since both implants are done sequentially, only one lithographic step is required to mask off the other regions. This is accomplished through the complete removal of the silicon nitride side wall spacer after differential silicon dioxide thicknesses are established over the source/drain regions. It will be appreciated that in order to implement SWS-LDD structures on both n- and p-type transistors in a CMOS technology, one reduction of a lithographic step for each type of transistor would be realized.

Figure 3A:
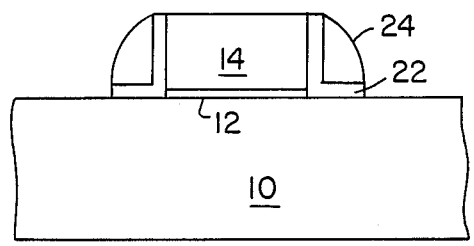
FIGS. 3(a)–3(c) are cross sections of a self-aligned silicide LDD MOS device at various stages of its fabrication in accordance with a third embodiment of the invention.
Figure 3B:
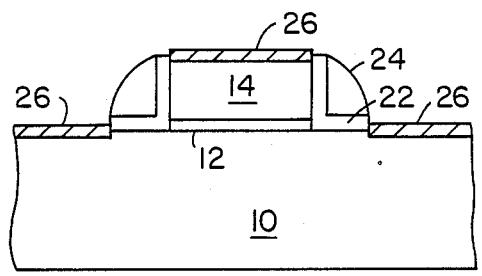

FIG. 3 illustrates a process in accordance with a third embodiment of the invention, which relates to the formation of a self-aligned silicide structure in which source/drain dopants are introduced after silicidation. In this method a structure as shown in FIG. 2(a) is obtained as described above, with respect to the second embodiment of the invention, and the silicon dioxide that is not covered by the silicon nitride side wall spacer is completely removed. This can be accomplished either by plasma/reactive ion etching or preferably by a wet chemical etch, using hydrofluoric acid. The resulting structure is shown in FIG. 3(a) in which the silicon dioxide layer 22 is covered by the silicon nitride side wall spacer 24. The oxide gate insulator film 12 is sandwiched between the polysilicon gate 14 and the silicon substrate 10. Silicide is subsequently formed over the exposed silicon regions as well as over the polysilicon gate. This may be accomplished through the use of a per se conventional technique consisting of depositing a layer of metal such as titanium and sintering the metal thermally, followed by a selective wet etch that removes the unreacted metal to form titanium silicide. Other silicide systems such as cobalt or tungsten silicide may also be employed in this method by the use of tungsten or cobalt in this step, or, if desired, the tungsten may be selectively deposited. The self-aligned silicide structure after this silicidation step is illustrated in FIG. 3(b).

Figure 3C:
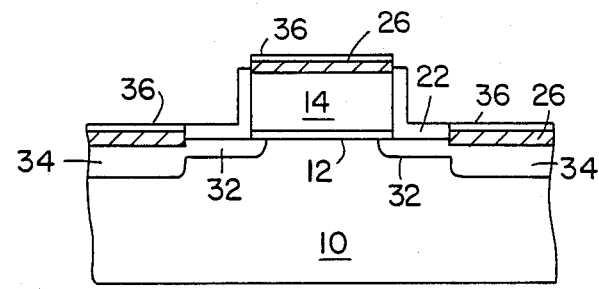

An oxidation step is subsequently performed to grow a layer of silicon dioxide on top of the silicide, but very little is grown on the silicon nitride side wall spacer. The thickness of this silicon dioxide layer should be sufficient to protect the titanium silicide during the subsequent silicon nitride side wall spacer removal. A thickness of greater than 100A would be needed for this purpose. After the oxidation step, the wafer is subjected to a silicon nitride etch, such as a phosphoric acid etch or a plasma etch, to remove the silicon nitride side wall spacer without attacking either the silicide or the polysilicon gate since they are protected by the silicon dioxide layer. A light and a heavy ion implant are then carried out; with the subsequent thermal processing, they define the lightly doped region 32 and the heavily doped region 34 as shown in FIG. 3(c).

The additional protective silicon dioxide layer 36 may not be necessary for other silicides that have a very low etch rate during the silicon nitride side wall spacer removal. Silicon dioxide layer 36, however, does provide another benefit in that it is able to prevent dopant out diffusion after the dopant is subsequently implanted into the silicide layer 26 and has received heat treatment. The thickness of the silicide layer 26 is determined by the desired sheet resistance in the source/drain regions and is also determined by the subsequent ion implantation and anneal conditions to form the heavily doped junction 34. Additionally, the titanium silicide thickness should preferably have substantially less stopping power than the first layer of silicon dioxide 22 during the subsequent heavy ion implantation. Another consideration for the second layer of silicon dioxide 36 is that its thickness combined with that of the titanium silicide layer 26 should have less stopping power than the first layer of silicon dioxide 22 in the subsequent heavy ion implantation. A thickness of the titanium silicide layer of between 100 A and 2000 A coupled with a silicon dioxide thickness between 150 A and 2000 A on silicon dioxide layer 22 and a thickness of silicon dioxide layer 36 between 100 A and 2000 A, subject to the above constraints, should serve this purpose.

The selection of the ion implant conditions should be optimized with respect to the thicknesses mentioned. The majority of the heavy ion implant dose should be blocked by silicon dioxide layer 22 on top of the lightly doped region 32. A significant amount of the dopant should at least penetrate silicon dioxide layer 36 to stay in the silicide layer 26 or to penetrate both layers 26 and 36. To achieve this goal and to allow greater flexibility in this optimization process, the optional second layer of silicon dioxide can be etched back after the complete removal of the silicon nitride side wall spacer by using a plasma or reactive ion etching technique. In the event the majority of ions remain in the silicide, the subsequent thermal treatment should be optimized to drive the dopants into the silicon beneath it. The light ion implant should be such that the majority of the dose at least penetrates the silicon dioxide layer 22. In this particular example, arsenic is used for the heavy implant and phosphorus is used for the light implant for the n-type dopant. Since the silicon nitride side wall spacer is removed after the silicide is formed, it allows sequential ion implantations to define both the lightly and heavily doped regions with a single lithographic step for each source/drain dopant polarity.

It will be appreciated that the method of the invention, as described hereinabove with respect to three embodiments, meets the objects set forth above in the fabrication of MOS devices. It will also be appreciated that modifications may be made in the embodiments of the inventive process herein described without necessarily departing from the spirit and scope of the present invention.

What is claimed is:

1. A method of fabricating an MOS integrated circuit, said method comprising the steps of:
   providing a silicon substrate;
   prior to the formation of source and drain regions in the upper surface of said substrate, defining a polysilicon gate on the upper surface of said substrate;
   depositing a layer of a first material over said polysilicon gate and over at least a part of the exposed upper surface of said substrate, said first material having a different etch characteristic as compared to that of said silicon substrate;

depositing and forming by etching a side wall spacer about said polysilicon gate of a second material having a different etching characteristic than said first material, said first layer serving as an etching stop;

thereafter removing said first layer in regions of the upper surface of said substrate and said polysilicon gate not covered by said side wall spacer;

depositing a metal and thereafter reacting said metal with the exposed surfaces of said substrate and said polysilicon gate, thereby to form a layer of a silicide of said metal thereat of a thickness such that said silicide layer has substantially less ion implant stopping power than said first layer;

thereafter removing said side wall spacer;

and thereafter performing sequentially a light and a heavy ion implant of the same dopant impurity through said silicide layer and said first layer, thereby to form source and drain regions in the upper surface of said substrate.

2. The method of claim 1, before the removal of said side wall spacer, further comprising the step of forming a second layer over said silicide layer but not over said side wall spacer, the combined thickness of said second layer and said silicide layer being selected such that said silicide and second layers have substantially less ion implant stopping power as compared to that of said first layer.

3. The method of claim 2, in which said first and second layers are each silicon dioxide, and said side wall spacer material is silicon nitride.

4. The method of claim 3, in which said metal is selected from the group consisting of titanium, cobalt and tungsten.

5. The method of claim 3, in which the etching of said silicon nitride side wall spacer is by one of a plasma and reactive ion etching technique, the removal of said first silicon dioxide layer is by a wet hydrofluoric etch, and the removal of said silicon nitride side wall spacer is by one of a wet phosphoric etch or a plasma etch.

6. The method of claim 3, in which said first layer of silicon dioxide is thermally grown to a thickness of between 150 A and 2000 A, said silicon nitride side wall spacer is deposited by a chemical vapor deposition technique to a thickness of at least 1000 A, and said second silicon dioxide layer is thermally grown to a thickness of between 100 A and 2000 A.

7. The method of claim 6, in which the thickness of said silicide layer is between 100 A and 2000 A.

8. The method of claim 1, in which said first layer is silicon dioxide and said side wall spacer material is silicon nitride.

9. The method of claim 8, in which said metal is selected from the group consisting of titanium, cobalt and tungsten.

10. The method of claim 8, in which the etching of said silicon nitride side wall spacer is by one of a plasma and reactive ion etching technique, the removal of said first silicon dioxide layer is by a wet hydrofluoric etch, and the removal of said silicon nitride side wall spacer is by one of a wet phosphoric etch or a plasma etch.

11. The method of claim 8, in which said first layer of silicon dioxide is thermally grown to a thickness of between 150A and 2000A, and said silicon nitride side wall spacer is deposited by a chemical vapor deposition technique to a thickness of at least 1000A.

12. The method of claim 11, in which the thickness of said silicide layer is between 100A and 2000A.

* * * * *